United States Patent [19]

Suzuki et al.

[11] Patent Number: 4,836,889
[45] Date of Patent: Jun. 6, 1989

[54] SURFACE TREATING METHOD FOR POLYACETAL RESIN MOLDED ARTICLES

[75] Inventors: Yoshiharu Suzuki, Shizuoka; Tomoyuki Aketa, Fuji, both of Japan

[73] Assignee: Polyplastics Co., Ltd., Osaka, Japan

[21] Appl. No.: 131,060

[22] Filed: Dec. 10, 1987

[30] Foreign Application Priority Data

Jan. 16, 1987 [JP]  Japan ................................ 62-7526

[51] Int. Cl.$^4$ ................................................ C08K 9/04
[52] U.S. Cl. ................................ 156/667; 156/668; 252/79.2
[58] Field of Search ............... 156/635, 656, 667, 664, 156/668; 252/79.2

[56] References Cited

U.S. PATENT DOCUMENTS

| | | | |
|---|---|---|---|
| 3,235,426 | 2/1966 | Bruner | 156/2 |
| 3,554,880 | 1/1971 | Jenkin | 204/30 |
| 3,905,877 | 9/1975 | Deyrup | 204/30 |
| 3,963,590 | 6/1976 | Deyrup | 204/30 |
| 4,370,197 | 1/1983 | Abolafia et al. | 156/659.1 |
| 4,418,162 | 11/1983 | Kasuga et al. | 525/398 X |
| 4,448,637 | 5/1984 | Hiraishi et al. | 156/635 |
| 4,464,435 | 8/1984 | Hattori et al. | 428/409 |

*Primary Examiner*—David L. Lacey
*Assistant Examiner*—Thi Dang
*Attorney, Agent, or Firm*—Nixon & Vanderhye

[57] ABSTRACT

A surface treating method for polyacetal resin molded articles is characterized in that the surface of a molded article made of a polyacetal resin composition including 99.5~80 parts by weight of a polyacetal resin and 0.5~20 parts by weight of one or more kinds of fine powdery metallic oxides having a mean particle diameter of 0.1~20$\mu$ is etched with an acidic solution containing one or more kinds of inorganic acids selected from the group consisting of sulfuric acid, hydrochloric acid, and phosphoric acid.

5 Claims, No Drawings

SURFACE TREATING METHOD FOR POLYACETAL RESIN MOLDED ARTICLES

INDUSTRIAL FIELD OF APPLICATION

This invention relates to a surface treating method for polyacetal resin molded articles. More particularly, the invention relates to a surface treating method for efficiently obtaining polyacetal resin molded articles having surface characteristics suitable for surface decoration by printing, coating, deposition, plating, and otherwise, and/or for adhesion with an adhesive.

PRIOR ART

Polyacetal resins are chemically very stable and lack surface activity. This, coupled with the fact that there is no suitable solvent available which has good affinity to such resin, has virtually defied the possibility of subjecting products of such resin to such surface decoration as plating, printing, coating, or deposition, or surface bonding with an adhesive. Therefore, polyacetal resin has not been employed for uses requiring such finish. Recently, however, end-use applications of polyacetal resins have become diversified and sophisticated, and therefore the current trend is such that for some uses, special characteristics such as decorativeness adhesion properties are sometimes required in addition to good mechanical, physical, and chemical properties and functional features. More particularly, for applications such as exterior trim parts, metallic surface characteristics are often required.

As attempts to improve the surface workability of polyacetal resins, for example, their adaptability to surface cladding, methods for treating the surface of a molded article with phosphoric acid, p-toluenesulfonic acid, sulfuric acid, etc. have been proposed in the specifications of U.S. Pat. No. 3,235,426, U.S. Pat. No. 3,554,880, U.S. Pat. No. 3,905,887, and U.S. Pat. No. 3,963,590. With these methods, however, it is difficult to impart such surface workability to polyacetal resin molded articles as will meet practical utility requirements.

As more recent approaches for surface treatment of polyacetal resins, Japanese Provisional Patent Publication Nos. 78023 of 1980 and 152845 of 1981 disclose methods of the kind that a polyacetal resin is mixed with a material, such as metallic carbonate, which can easily be eluted with acid and that after molding, the metallic salt is eluted with a specific acid for removal, whereby the surface of the molded article is roughened. These methods mark a large step toward practicability of surface treatment, and actually they are in use for some applications. However, these methods involve difficulties in that, under the action of the carbonate or the like, not only is the material liable to discolor and lose its stability property due to thermal history in the course of composition preparation and molding operation, but also the surface working characteristics of the molded article are likely to vary.

SUMMARY OF THE INVENTION

In order to overcome these difficulties and obtain a polyacetal molded article having good surface working characteristics, the present inventors discovered that if the surface of a molded article made of a polyacetal resin composition comprising 99.5~80 parts by weight of a polyacetal resin and 0.5~20 parts by weight of one or more kinds of fine powdery metallic oxides having a mean particle diameter of 0.1~20μ was etched with an acidic solution containing one or more kinds of inorganic acids selected from the group consisting of sulfuric acid, hydrochloric acid, and phosphoric acid, the surface working characteristics of the polyacetal resin molded article could be improved.

The present invention therefore provides a method for treating a surface of a moulded article of polyacetal, which comprises the step of etching an article moulded from a polyacetal composition comprising 80 to 99.5 parts by weight of a polyacetal resin and 20 to 0.5 parts by weight of fine particles of a metal oxide having an average particle diameter of 0.1 to 20 microns with an acidic solution containing an inorganic acid selected from the group consisting of sulfuric acid, hydrochloric acid and phosphoric acid.

It is preferable that the metal oxide is an oxide of a metal belonging to the group II of the periodic table and the acidic solution contains both sulfuric acid and hydrochloric acid or both sulfuric acid and phosphoric acid.

In the invention, the term "metallic oxides" refers to compounds such as, for example, magnesium oxide, calcium oxide, barium oxide, zinc oxide, aluminum oxide, and titanium oxide, and one or more of these kinds of oxides are used; more particularly, oxides of group II metals in the periodic table are preferred.

The reason why the use of such fine powdery metallic oxide is effective for the purpose of the invention is presumably that whereas if no such filler is used, a chemically stable non-crystalline skin layer is formed on the surface of the crystalline polyacetal resin molded article, which hinders the formation of a roughened surface, the fine powdery metallic oxide, if incorporated by admixture with the resin, acts as a nucleating agent to develop crystallization at the surface layer, thereby facilitating surface erosion, and the metallic oxide elutes itself to help in effective etching.

In the invention, such metallic oxide in fine powder form having a mean particle diameter of 0.1~20μ is used. If the mean particle diameter is less than 0.1μ, no sufficient effect of surface roughening is obtainable by the process of acid treatment which will be described hereinafter, it being thus unable to obtain a molded article having good surface working characteristics. If the mean particle diameter is more than 20μ, the surface will be excessively roughened, it being thus unable to obtain good mirror finish or sufficient adhesion in the process of after-treatment, such as plating, for example. Preferably, such metallic oxide having a mean particle diameter of 0.3~10μ, more preferably 0.5~5μ, is used.

If the proportion of such metallic oxide is too small, no sufficient surface roughening can be effected by acid treatment, and thus no good surface workability, e.g. strong plating bond, can be obtained. If the proportion is too large, the resin will be degraded in mechanical strength, moldability, and the like characteristics, and further the process of surface roughening will excessively progress, thus leading to poor appearance effect. Considering the balance of these, the ratio of polyacetal resin/metallic oxide is 99.5~80/0.5~20 by weight, preferably 99~90/1~10.

Polyacetal resins useful for the purpose of the invention are not particularly limited. Polyacetal homopolymers and polyacetal copolymers in which a larger part of a main chain consists of an oxymethylene chain, and also modified forms of these polyacetal resins which are obtained by known crosslinking or graft copolymerization techniques, may be equally effectively used as base resins for the purpose of the invention.

It is desirable to incorporate such known additives as an anti-oxidant and a heat stabilizer by admixture into a polyacetal resin composition used in the invention. Further, depending upon the purpose for which the product is used, it is possible to incorporate by admixture any known material which is usually added to any ordinary type of thermoplastic or thermosetting resin, insofar as it is not much detrimental to the process of surface roughening with an etching solution and to the post-etching surface working characteristics and other properties of the molded article.

For example, various kinds of stabilizers for light resisting and weathering purposes, lubricants, parting agents, plasticizers, nucleating agents, antistatic agents, surface active agents, and lubricating agents may be used for such addition.

The polyacetal resin used as a base may be mixed with any of other kinds of thermoplastic resins including, for example, polyurethane resin, fluorine plastic, polyethylene, polypropylene; olefin monopolymer or copolymer, such as ethylene-propylene copolymer, ethylene-vinyl acetate copolymer, or ethylene-alkyla-crylate copolymer; vinyl-based compound, such as styrene-butadiene-acrylonitrile copolymer or styrene-acrylonitrile copolymer, and their copolymers; graft copolymer composed of polyacrylate resins; polyamide resins; polymers of thermoplastic segment type copolyesters; and other organic polymeric materials including modified forms of these resins. Further, a molded article made of such composition may incorporate any of such materials as glass fiber, metallic fiber, boron, potassium titanate, ceramic, glass flake, glass bead, mica, talc, highly dispersible silicate, silica flour, quartz sand, wollastonite, various kinds of metallic powder, metallic foil, and other inorganic compounds in fibrous, lamellar, granular, and powdery forms, such as silicon carbide, boron nitride, and silicon nitride, also their whiskers and metallic whiskers.

Molded articles made of such composition according to the invention can be easily produced by any known method. For example, one method is such that after individual ingredients are mixed together, the mixture is kneaded and extruded by an extruder into a pellet, the pellet being then molded to shape. Another method is such that pellets of different compositions are first prepared and then they are mixed in predetermined proportions, the mixture being subjected to molding, so that a mold article of a predetermined composition is obtained after molding operation. Another available method is such that individual ingredients are directly supplied into a molding machine. Any of these methods can be conveniently employed.

According to the invention, such polyacetal resin molded article is subjected to etching, for which purpose an acidic solution containing one or more kinds of inorganic acids selected from the group consisting of sulfuric acid, hydrochloric acid, and phosphoric acid is used. Treatment with an acidic solution containing none of these acids cannot provide any sufficient surface working characteristics. Use of a treating solution containing an oxidative acid in any excessive proportion is undesirable, because it will invite excessive surface roughening, thus causing strength reduction and poor mirror effect. According to the invention, an aqueous mixture solution of sulfuric acid and hydrochloric acid and an aqueous mixture solution of sulfuric acid and phosphoric acid are advantageously used; and preferred mixture ratios in these aqueous solutions are: 96% sulfuric acid/36% hydrochloric acid/water=20~60/5~30/the rest (in wt %; and 96% sulfuric acid/85% phosphoric acid/water=20~60/20~60/the rest (in wt %).

For the purpose of etching the polyacetal molded article with such acidic solution, optimum dipping conditions are suitably pursued and selected according to the composition of the etching solution, but generally preferred conditions are 5 sec~30 min dipping at 10°~80° C. Optimum conditions are often selected within this range.

Such etching solution according to the invention may incorporate by admixture any of such materials as thioureas, amines, amides, or thioethers in order to prevent poor roughening due to deterioration of the solution with time, or a surface active agent in order to prevent bubble deposition on the surface of the molded article in the process of etching.

In the invention, it is also possible to subject the molded article to a known treatment prior to or after or simultaneously with etching. For example, the molded article may be heat treated or hot-water treated, or dipped in a solution containing a particular compound before or after etching. Such treatment after etching may be carried out in combination with stages for neutralization of the etching solution, washing, drying, etc.

EXAMPLES

The treating method of the invention will be described in further detail with reference to the following examples and comparative examples. It is to be understood, however, that the invention is not limited by these examples.

Examples 1~7 and Comparative Example 1

Ninety-five parts by weight of a polyacetal resin, "Jurakon® M90" (an acetal copolymer, ordinary grade, produced by Polyplastics Co.) and 5 parts by weight of each one of the metallic oxides shown in Table 1 were premixed in a tumbler, and the mixture was then melt kneaded in an extruder, being extruded therefrom in the form of a pellet. Test specimens (each of 70 mm×50 mm×3 mm) were prepared by employing an injection molding machine.

Each test specimen was dipped and washed in a commercially available alkaline degreaser "Ace Kurin A220" (producer by Okuno Seiyaku Kogyo K.K.) at 60° C. for 5 min, and then it was dipped for etching in a solution composed of 96% sulfuric acid/85% phosphoric acid/water=40/25/35 (weight ratio) at 40° C. for 8 min.

After etching, the specimen was washed in water and then dipped in a 5 wt % sodium hydroxide solution for 3 min. for neutralization.

After neutralized, the specimen was water-washed and then dipped in a commercially available catalyzing solution "Catalyst" (produced by Okuno Seiyaku Kogyo K.K.) for 3 min. After water-washing, the specimen was dipped in a 5 wt % hydrochloric acid solution for 2 min, being thereby surface-activated. After surface activation, it was dipped in a commercially available electroless nickel solution (produced by Okuno Seiyaku Kogyo K.K., TMP nickel plating solution) for 12 min treatment at 35° C. The process of pre-treatment was thus completed.

After the pre-treatment, the specimen was subjected to electroplating in a predetermined manner. A mean deposit thickness was set at: copper 40 μm, nickel 10 μm, and chrome 0.1 μm. Performance characteristics of the specimens thus plated were as shown in Table 1.

Plate peel strength was determined in the following manner: 10 mm wide parallel cuts were made on the plate surface and one end of such cut was lifted and pulled in a direction angled at 90° to the surface of the test specimen, the stress of the pull being taken as plate peel strength. Appearance evaluation was made by visual inspection through naked eye. The degree of adhesivity required for practical service is considered to be 1 kg/cm or more, and in the light of this criterion, the resin molded article specimens which were surface treated according to the method of the invention were found as being well qualified for practical use.

For the purpose of comparison, specimens incorporating no metallic oxide were plated according to same recipes as used in Examples 1~7, but no plate with good adhesion effect was obtained. The results are also shown in Table.

TABLE 1

| | Filler | | | | Plate peel strength (kg/cm) |
|---|---|---|---|---|---|
| | Kind | Mean pcle dia (μm) | Propn (wt part) | *1 Appearance | |
| Example 1 | Calcium oxide (CaO) | 4.0 | 5.0 | O | 2.3 |
| Example 2 | Barium oxide (BaO) | 5.0 | 5.0 | O | 2.1 |
| Example 3 | Magnesium oxide (MgO) | 5.0 | 5.0 | O | 2.5 |
| Example 4 | Zinc oxide (ZnO) | 0.5 | 5.0 | O | 2.4 |
| Example 5 | Titanium oxide (TiO$_2$) | 0.5 | 5.0 | O | 1.7 |
| Example 6 | Aluminum oxide (Al$_2$O$_3$) | 0.5 | 5.0 | O | 1.6 |
| Example 7 | Boron oxide (B$_2$O$_3$) | 3.5 | 5.0 | O | 1.4 |
| Comp. Ex 1 | — | | | ⊚ | 0.5 |

*1 Visually evaluated
⊚ Highly specular
O Generally specular (reflected image not dim)
Δ Reflected image slightly dim
x Specular effect poor (image dim)

Examples 8~9 and Comparative Examples 2~3

Specimens incorporating same magnesium (having a mean particle diameter of 5μ) as in Example 3 were treated and plated in same way as in Example 3, except that the proportion of the magnesium was varied from that in Example 3.

The results are shown in Table 2.

TABLE 2

| | polyacetal resin/ magnesium oxide (wt part) | *1 Plate appear. | Plate peel str. (kg/cm) | Before-plating tensile str. (kg/cm$^2$) | stretch (%) |
|---|---|---|---|---|---|
| (Comp. Exp. 1) | 100/0 | ⊚ | 0.5 | 620 | 24 |
| Comp. Exp. 2 | 99.75/0.25 | ⊚ | 0.7 | 620 | 21 |
| Example 8 | 98/2 | O | 1.8 | 610 | 20 |
| (Example 3) | 95/5 | O | 2.5 | 590 | 16 |
| Example 9 | 90/10 | O | 2.3 | 550 | 12 |
| Comp. Exp. 3 | 70/30 | X | 1.4 | 430 | 5 |

*1 See Table 1.

Examples 10~12, and Comparative Example 4

In each case, 95 parts by weight of aforesaid polyacetal resin were mixed with 5 parts by weight of a magnesium oxide having such mean particle diameter as shown. Specimens were treated and plated in same manner as in Example 3.

The results are shown in Table 3.

TABLE 3

| | Magnesium oxide | | *1 Plate appear. | Plate peel str. (kg/cm) |
|---|---|---|---|---|
| | Mean particle dia (μm) | Propn (wt pt) | | |
| Example 10 | 0.3 | 5 | O | 1.9 |
| Example 11 | 1.5 | 5 | O | 2.4 |
| (Exp. 3) | 5.0 | 5 | O | 2.5 |
| Example 12 | 12.0 | 5 | O*2 | 2.0 |
| Comp. Exp 4 | 30.0 | 5 | Δ*3 | 1.5 |

*1 See Table 1.
*2 Microspots were present on the surface.
*3 Relatively large spots were present in large number on the surface; not qualified for practical use.

Examples 13~17 and Comparative Examples 5~6

Same experiments as Example 3 were carried out except that the composition of etching solution was varied. Etching solution compositions used and evaluation results are shown in Table 4. For the purpose of comparison, evaluation was likewise made with respect to other etching solutions in which an acid other than those specified in the invention was used.

The results are shown in Table 4.

TABLE 4

| | Etching solution composition (wt part) | Etching time | Plate *1 appearance | Plate peel (kg/cm) |
|---|---|---|---|---|
| (Example 3) | 96% sulfuric acid/85% phosphoric acid/water = 40/25/35 | 40° C. × 8 min | O | 2.5 |
| Example 13 | 96% sulfuric acid/85% phosphoric acid/water = 28/42/30 | 40° C. × 10 min | O | 2.1 |
| Example 14 | 96% sulfuric acid/85% phosphoric acid/water = 55/10/35 | 40° C. × 5 min | O | 2.4 |
| Example 15 | 96% sulfuric acid/36% hydrochloric acid/water = 35/20/45 | 25° C. × 15 min | O | 2.4 |
| Example 16 | 96% sulfuric acid/36% hydrochloric acid/water = 48/12/40 | 25° C. × 15 min | O | 2.3 |
| Example 17 | 96% sulfuric acid/36% hydrochloric acid/water = 45/0/55 | 40° C. × 10 min | O | 1.5 |
| Comp. Ex 5 | 98% nitric acid/water = 60/40 | 40° C. × 10 min | Δ | 0.8 |
| Comp. Ex 6 | 90% formic acid = 100 | 40° C. × 30 min | O | 0.6 |

*See Table 1.

Example 18 and Comparative Example 7

Treatment and evaluation were made in same manner as in Example 3, except that an acetal homopolymer "Tenac ® 5010" (produced by Asahi Chemical Industry Co.) was used in place of the Example 3 polyacetal resin. For the purpose of comparison, specimens containing no magnesium oxide were also evaluated in same manner.

The results are shown in Table 5.

TABLE 5

| | Filler | | | Plate |
|---|---|---|---|---|
| | Kind | Mean pcle dia (μm) | Propn (wt part) | *1 Plat appear. | peet str. (kg/cm) |
| Example 18 | Magnesium oxide | 5 | 5 | ○ | 2.1 |
| Comp. Exp 7 | — | — | — | ⊚ | 0.6 |

*1 See Table 1.

Examples 19~21 and Comparative Examples 8~10

A resin composition comprising 95 parts by weight of a polyacetal resin "Jurakon ® M90" (produced by Polyplastics Co., Ltd.) and 5 parts by weight of magnesium oxide was used. After having been detained for 2~30 min in an injection molding machine set at a cylinder temperature of 200° C. (except for the feeder portion which was set at 170° C.), the composition was molded into test specimens. Etching was then carried out in same manner as in Examples 1~7. Plating was effected, and evaluation was made as to those items shown in Table 6.

For the purpose of comparison, specimens prepared from a composition containing calcium carbonate instead of magnesium oxide were used and evaluation was made in same manner.

Results are shown in Table 6.

With those incorporating calcium carbonate, it was observed that with the increase in the time of detention in the molding machine, the plate adhesivity was somewhat lowered and the performance characteristics varied widely. Apparently, they showed lack of stability. In contrast, no problem was seen with the specimens containing magnesium oxide in accordance with the invention.

TABLE 6

| | Filler | | | Molder detention time (min) | Molding*2 discoloration | Plate*1 appearance | Plate peel test (n = 10) | | |
|---|---|---|---|---|---|---|---|---|---|
| | Kind | Mean particle dia (μm) | Propn. (wt part) | | | | Peel str (kg/cm) | Variability R (kg/cm) | σ (kg/cm) |
| Example 19 | Magnesium oxide (MgO) | 5.0 | 5 | 2 | ⊚ | ○ | 2.5 | 0.5 | 0.15 |
| Example 20 | Magnesium oxide (MgO) | 5.0 | 5 | 10 | ○ | ○ | 2.4 | 0.4 | 0.15 |
| Example 21 | Magnesium oxide (MgO) | 5.0 | 5 | 30 | ○~△ | ○ | 2.5 | 0.6 | 0.18 |
| Comp. Ex 8 | Calcium carbonate (CaCO₃) | 5.0 | 5 | 2 | ⊚ | ○ | 2.3 | 0.6 | 0.18 |
| Comp. Ex 9 | Calcium carbonate (CaCO₃) | 5.0 | 5 | 10 | △ | ○ | 2.0 | 0.9 | 0.24 |
| Comp. Ex 10 | Calcium carbonate (CaCO₃) | 5.0 | 5 | 30 | X | ○~△ | 1.9 | 1.4 | 0.31 |

*1 See Table 1.
*2 Degree of yellowing

⊚ ⟵⟶ X
No yellowing    Yellowing noticeable

As is clear from the foregoing description and above given examples, by surface treating a molded article made from a composition comprising a polyacetal resin and, in mixture therewith, a metallic oxide having a mean particle diameter of $0.1 \sim 20\mu$ with an acidic solution containing one or more kinds of inorganic acids selected from the group consisting of sulfuric acid, hydrochloric acid, and phosphoric acid, it is now possible to notably improve the surface working characteristics of the molded article, such as, for example, surface affinity to plating and coating, without detriment to the inherent excellent properties of polyacetal resins.

What is claimed is:

1. A method for treating a surface of a moulded article of polyacetal, which comprises the step of etching an article moulded from a polyacetyl composition comprising 80 to 99.5 parts by weight of a polyacetal resin in admixture with 20 to 0.5 parts by weight of fine particles of a metal oxide having an average particle diameter of 0.1 to 20 microns with an acidic solution containing an inorganic acid which is selected from the group consisting of sulfuric acid, hydrochloric acid, phosphoric acid and mixtures thereof.

2. A method as claimed in claim 1, in which the metal oxide is at least one oxide of a metal belonging to the group II of the periodic table.

3. A method as claimed in claim 1, in which said acidic solution contains both sulfuric acid and hydrochloric acid or both sulfuric acid and phosphoric acid.

4. A method for surface roughening a molded polyacetal resin article comprising treating a surface of an article consisting essentially of between 80 to 99.5 parts by weight of a polyacetal resin and between 20 to 0.5 parts by weight of fine particles dispersed with said polyacetal resin of an oxide of a Group II metal of the Periodic Table with an inorganic acid which is selected from the group consisting of sulfuric acid, hydrochloric acid, phosphoric acid and mixtures thereof, whereby the surface of the article is roughened.

5. A method as in claim 4, wherein said metal oxide particles are selected from the group consisting of magnesium oxide, calcium oxide, barium oxide, zinc oxide, aluminum oxide titanium oxide, and mixtures thereof.

* * * * *

UNITED STATES PATENT AND TRADEMARK OFFICE
CERTIFICATE OF CORRECTION

PATENT NO. : 4,836,889

DATED : June 6, 1989

INVENTOR(S) : Suzuki et al

It is certified that error appears in the above-identified patent and that said Letters Patent is hereby corrected as shown below:

Column 1, line 19, delete "such" and after "decoration" insert --such--;
        line 22, after "requiring" insert --a finished surface-- and delete "such finish";
        line 23, after "applications" delete "of" and insert --for--;
        line 26, change "decorativeness" to --decorative--;
        line 46, after "methods" delete "of the kind that" and insert --wherein--;
        line 48, after "acid" delete "and" and insert --such--.

Column 2, line 35, after "surface" insert a period (.) and change "the" to --The--;
        line 42, delete "no";
        line 43, delete "sufficient effect of" and insert --insufficient--;
        line 54, delete "no sufficient" and insert --insufficient--.

Column 3, line 11, after "not" delete "much";
        line 49, after "then" delete "they";
        line 52, after "after" insert --the--;
        line 62, after "provide" delete "any";

Column 4, line 23, after "prior to" insert a comma (,) and delete "or" (first occurrence)
        line 58, after "after" delete "neutralized" and insert --neutralization--.

UNITED STATES PATENT AND TRADEMARK OFFICE
CERTIFICATE OF CORRECTION

PATENT NO. : 4,836,889
DATED : June 6, 1989
INVENTOR(S) : Suzuki et al

It is certified that error appears in the above-identified patent and that said Letters Patent is hereby corrected as shown below:

Column 5, line 48, after "incorporating" insert --the--.

Column 6, line 42, delete "Same" and insert --The same--.

Signed and Sealed this

Sixth Day of March, 1990

Attest:

JEFFREY M. SAMUELS

Attesting Officer

Acting Commissioner of Patents and Trademarks